United States Patent [19]

Ebata

[11] Patent Number: 4,982,693
[45] Date of Patent: * Jan. 8, 1991

[54] SEMICONDUCTOR VAPOR PHASE GROWING APPARATUS

[75] Inventor: Hitoshi Ebata, Mishima, Japan

[73] Assignee: Toshiba Kikai Kabushiki Kaisha, Tokyo, Japan

[*] Notice: The portion of the term of this patent subsequent to Oct. 8, 2004 has been disclaimed.

[21] Appl. No.: 472,248

[22] Filed: Mar. 4, 1983

[30] Foreign Application Priority Data

Jun. 28, 1982 [JP] Japan .................. 57-111131

[51] Int. Cl.⁵ ............................. C23C 13/08
[52] U.S. Cl. .................... 118/666; 118/697; 118/715; 118/730
[58] Field of Search ............... 118/725, 666, 697, 724, 118/696, 730, 715; 427/8

[56] References Cited

U.S. PATENT DOCUMENTS

| | | | |
|---|---|---|---|
| 2,599,478 | 6/1952 | Peters et al. | 118/666 |
| 2,916,593 | 12/1959 | Herrick | 118/725 X |
| 3,171,755 | 3/1965 | Reuschel et al. | 118/725 X |
| 4,031,851 | 6/1977 | Camahort | 118/725 X |
| 4,396,640 | 8/1983 | Rocheleau et al. | 118/666 X |
| 4,430,959 | 2/1984 | Ebata et al. | 118/698 |

Primary Examiner—John D. Smith
Assistant Examiner—Bernard F. Plantz
Attorney, Agent, or Firm—Cushman, Darby & Cushman

[57] ABSTRACT

In a semiconductor vapor phase growing apparatus wherein a semiconductor wafer is heated in a reaction furnace, and an output of a source for heating, the temperature of the wafer, and flow quantities of gases supplied to the reaction furnace for vapor phase growing a semiconductor on the wafer by a chemical reaction of the gases are controlled by a control unit according to a predetermined sequences, there are provided a temperature detector for detecting the temperature of the wafer and output control means controlling the output of the source according to a given reference value. The control unit is consitituted by memory means storing a program of executing the sequences and linearly raising and lowering the wafer temperature at a predetermined temperature gradient in a plurality of divided time lateral units by making different the rates of temperature change in respective time interval units, and a CPU for processing the program.

4 Claims, 10 Drawing Sheets

| PP NO. | TIME | GAS FLOW | | | | | | θ °C |
|---|---|---|---|---|---|---|---|---|
| | | N₂ | H₂ | Dɴ | Dᴘ | SiCl₄ | HCl | TEMPE-RATURE |
| 1 | 3:00 | FN1L | | | | | | |
| 2 | 3:00 | | FN2L | | | | | |
| 3 | 3:00 | | ↓ | | | | | θ1 |
| 4 | 3:00 | | | | | | | θ2 |
| 5 | 3:00 | | | | | | FHCL | ↓ |
| 6 | 3:00 | | | | | | ↓ | ↓ |
| 7 | 3:00 | | | | | | ↓ | ↓ |
| 8 | 3:00 | | | | | | | θ3 |
| 9 | 3:00 | | | | FDP1 | FS1 | | ↓ |
| 10 | 3:00 | | | | ↓ | ↓ | | ↓ |
| 11 | 3:00 | | | | | | | ↓ |
| 12 | 3:00 | | | | FDP2 | FS2 | | ↓ |
| 13 | 3:00 | | | | ↓ | ↓ | | ↓ |
| 14 | 3:00 | | | | | | | ↓ |
| 15 | 3:00 | | | | | | | |
| 16 | 3:00 | | ↓ | | | | | |
| 17 | 3:00 | FN17L | | | | | | |
| (END) | | | | | | | | |

SEMICONDUCTOR VAPOR PHASE GROWING APPARATUS

BACKGROUND OF THE INVENTION

This invention relates to vapor phase growing apparatus for growing P or N type semiconductor layers on semiconductor wafers or substrates.

In semiconductor vapor phase growing apparatus, semiconductor substrates, for example, monocrystalline silicon wafers are placed in a gaseous mixture of hydrogen gas acting as a reaction gas, silicon tetrachloride acting as a carrier gas and a dopant gas acting as an impurity, and then heated to a temperature of about 1200° C. to cause a chemical reaction so as to form silicon layers on the wafers.

Thus, $H_2$ and $SiCl_4$ are caused to react with each other as follows.

$$2H_2 + SiCl_4 \rightleftarrows Si + 4HCl$$

Since the gaseous mixture contains a dopant gas the layers formed on the wafers are N type or P type silicon layers.

Since the wafer comprises a monocrystalline silicon substrate, its electroconductivity is extremely low so that it is possible to alternately deposit N type and P type silicon layers and to form an IC chip by forming a pattern of an integrated circuit.

Figure 1:
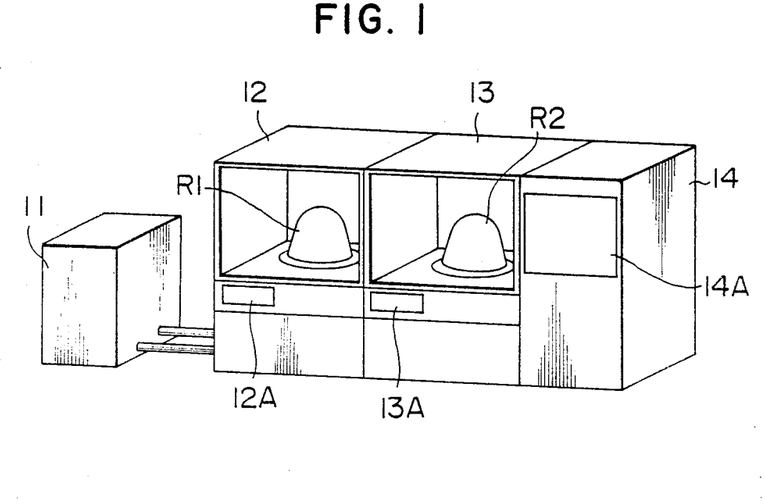
FIG. 1 is a general perspective view of semiconductor vapor phase growing apparatus utilized in this invention.

A typical example of semiconductor vapor phase growing apparatus is shown in FIG. 1 comprising a source of power, usually a high frequency generator, reaction furnaces R1 and R2 for effecting vapor phase growth, operating panels 12A and 13A provided for the main bodies 12 and 13 of the reaction furnaces R1 and R2 for opening and closing thereof, control unit 14 for controlling flow quantities of gases supplied to the reaction furnaces R1 and R2 and temperatures thereof, and an operating panel 14A of the control unit 14.

Figure 2:
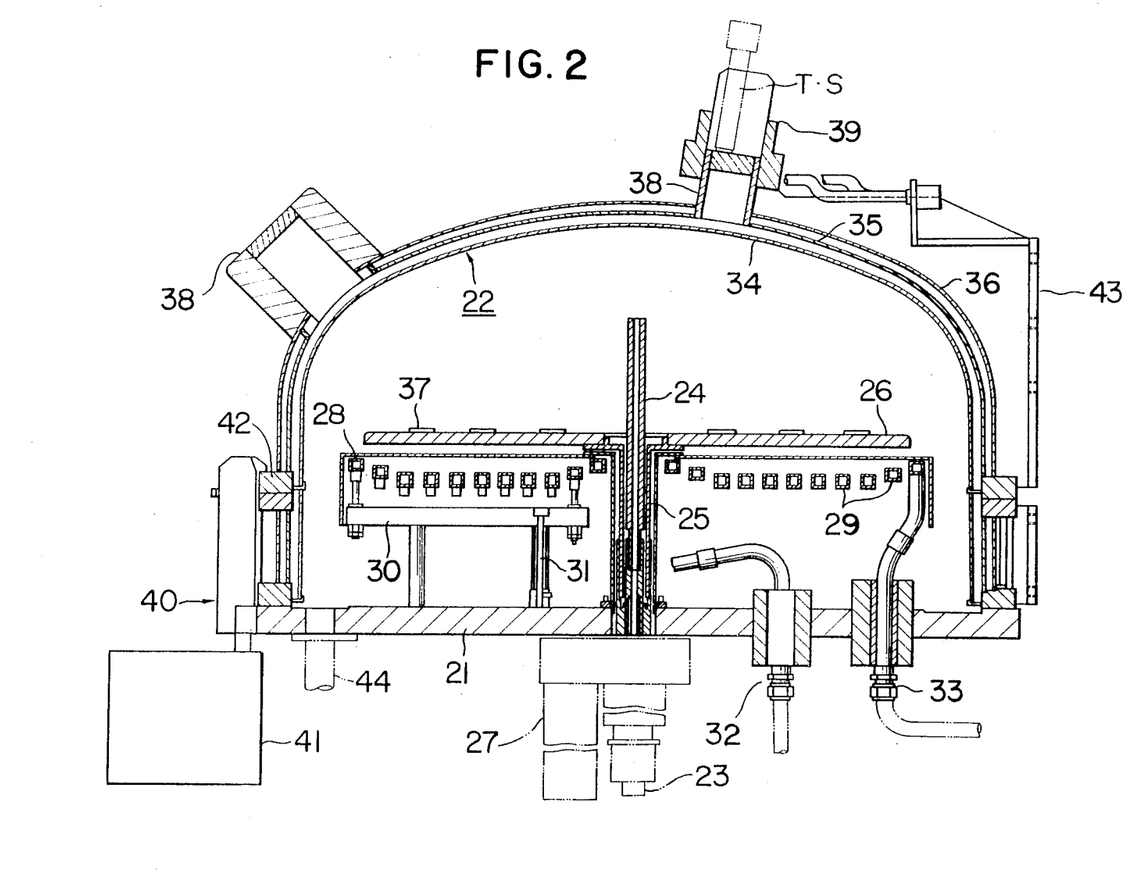
FIG. 2 is a vertical sectional view of one reaction furnace.

As shown in FIG. 2, each reaction furnace comprises a bottom plate 21 and a dome or lid 22 covering the bottom plate.

An inlet pipe 23 is provided at the center of the bottom plate 21 to admit reaction gases into the furnace through an inlet port at the top of the pipe 23. A rotary shaft 25 extends through the bottom plate 21 to concentrically surround the pipe 24 for supporting a circular disc shaped susceptor or support 26. The rotary shaft 25 is driven by an electric motor 27 having a reduction gearing.

Beneath the support 26 is disposed an induction heating coil 29 covered by a cover 28. The coil 29 is supported by an insulating plate 30 secured to the bottom plate 21 through bolts 31. Terminals 32 and 33 connected to the induction heating coil 29 extend through the bottom plate 21. Cooling water is passed through the induction heating coil 29 for removing heat generated by high frequency current flowing through the coil 29.

The dome 22 is of a three layer construction comprising an inner quartz layer 34, a first stainless steel layer 35, and a second stainless steel layer 36 which are spaced by air gaps. An observation window 38 extending through the first and second stainless steel layers 35 and 36 is provided for the top portion of the dome to observe the wafers 37 mounted on the rotary support 26 and a temperature detection window 39 provided with a temperature sensor TS for measuring the temperature of the furnace is also mounted on the top of the dome.

A clamping member 40 operated by an air cylinder device 41 is provided for cooperating with a flange 42 of the dome 22 to mount and dismount the same.

A bracket 43 is integrally formed with the dome 22 and moved in the vertical direction by a cylinder, not shown, to raise the dome 22 for exchanging the wafers 37 on the support 26. An exhaust pipe 44 is connected to the bottom plate 21.

To exchange wafers in the reaction furnaces R1 and R2, the operating panels 12A and 13A are operated to open the domes 22. Then wafers 37 on the support 26 are exchanged with new ones and then the domes are closed by manipulating operating panels 12A and 13A.

Under these conditions, the domes 22 are brought into intimate contact with the bottom plates 21 to airtightly seal the reaction furnaces. After that, the control unit 14 is operated for starting the vapor phase growth. Firstly, the control unit 14 supplies gases into the furnaces and controls the high frequency generator 11 to adjust the current value supplied to the induction heating coils.

Accordingly, gases are supplied into the reaction furnaces through pipes 24 and high frequency magnetic fields are produced corresponding to the current values, thus heating the wafers on the supports 26 by induction. At the same time, the temperature in the furnaces rises so that the gases supplied into the furnaces undergo above described chemical reaction to grow P type or N type silicon layers on the wafers 37.

As a result of the chemical reaction of the gases, the compositions of the gases change so that it is necessary to constantly exhaust gases in the furnaces to always fill the furnaces with fresh gases. The supports 26 are rotated by motors 27 to subject wafers 37 to the same condition at any position, thus making the thickness of the silicon, films grown by vapor phase method the same for all wafers.

Figure 3:
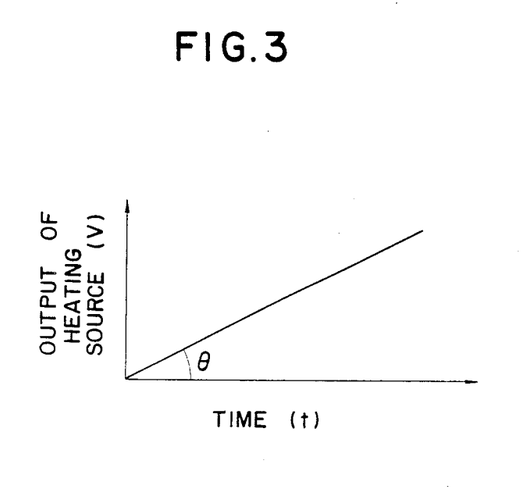
FIG. 3 is a graph showing an ideal heating characteristic.

Since the reaction temperature in the furnaces is about 1200° C., at start the furnace temperature is raised to 1200° C. from room temperature. However, when the temperature is raised rapidly the wafers crack resulting in a so-called slip phenomenon. Accordingly, it is necessary to control the output V of the high frequency source 11 such that the temperature of the furnaces vary linearly, as shown in FIG. 3.

Such control is made with the control unit 14. But in the past, a sequence controller has been used as the control unit 14 to operate as follows.

Figure 4:
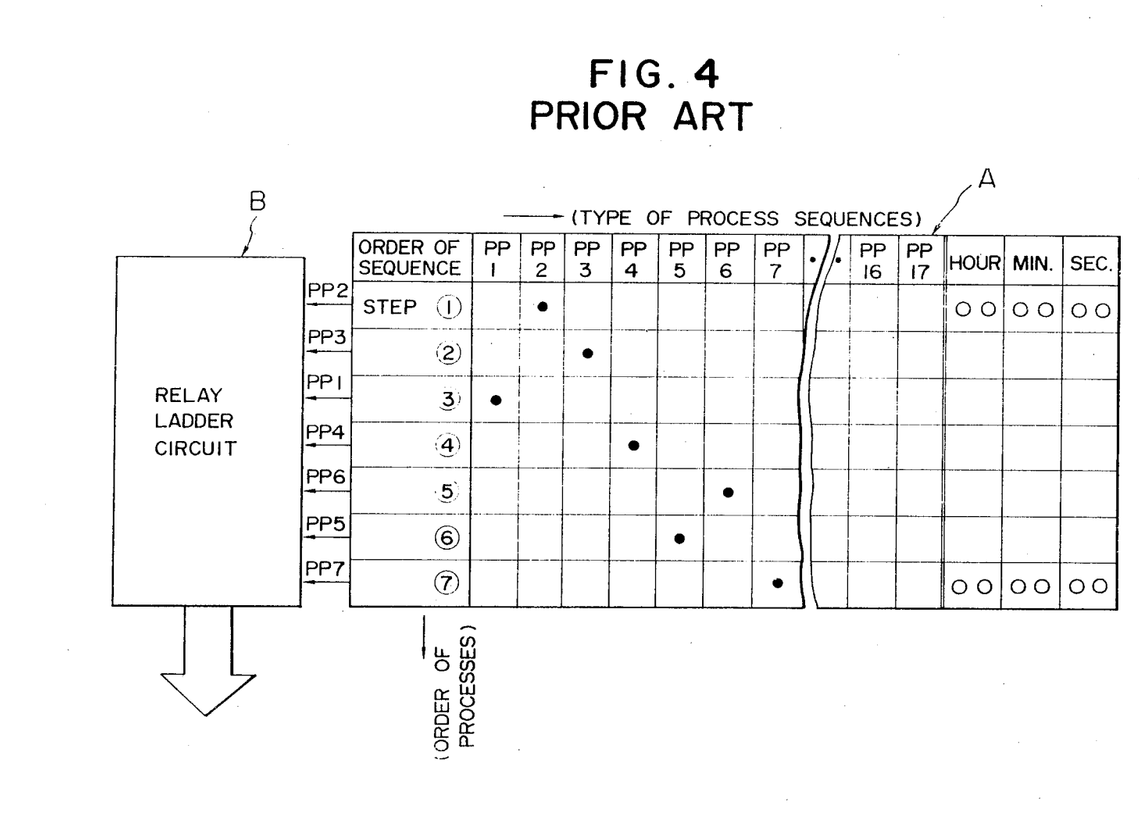
FIG. 4 shows one example of the construction of a prior art control unit.

As is well known in the art, the sequence controller performs predetermined controls for predetermined intervals according to a predetermined order, and is constructed as shown in FIG. 4 for example.

In FIG. 4, A designates a pin board switch panel arranged in a matrix comprising a plurality of bus lines spaced in the directions of column and row. At crosspoints of the bus lines, openings for receiving pins for short circuiting are provided. In FIG. 4, the order of the sequences is shown in the direction of the column, and the contents (the type of the process sequence) to be executed are shown in the direction of the row.

Thus, the order of executions of the sequences is shown by steps 1 through 7 while the type of the process sequences is shown by PP1 through PP17. The sequence controller is constructed to designate the execution times of respective steps 1 through 7. Thus, the types of the sequences to be executed at steps 1-7 are selected among PP1–PP17 and pins are inserted at positions of the selected types. In FIG. 4, dark spots show the positions at which pins are inserted.

B designates a relay ladder circuit incorporated with relay circuit enabling controls corresponding to the types of the sequences. Accordingly, the relay ladder circuit B produces a control output corresponding to the type of sequence instructed by the pin board switch panel A.

When the pins are set as shown in FIG. 4, the control unit 14 searches for what type of sequence has been set at step 1. In other words, a bus line in the direction of a row connected by a pin to a bus line corresponding to the step 1 is searched. Since at step 1, PP2 is connected by a pin, the bus line of PP2 would be detected when it is searched.

The detected information is sent to the relay ladder circuit B which operates the relay circuit for effecting a control corresponding to PP2 according to the information thereof. At this time, since a time information for executing the control is simultaneously given from the pin board switch panel A a control is executed for an interval corresponding to the time information. As this interval elapses, the same operation is carried out for the next step 2 to give an information PP3, thus causing the relay circuit to execute a control corresponding to PP3. Accordingly, process sequences are executed in an order of PP2→PP3→PP1 →PP4→PP6→PP5→PP7.

However, the control device described above merely applies control signals for controlling valves of various gases and cooling water, and for supplying and interrupting heating power.

In contrast, the flow quantities of the gases and the furnace temperature, the most important factors in actual operation, are set by such setters as variable resistors. In other words, these important factors are not controlled by the control device.

For example, an inclination angle $\theta$ (FIG. 3) of the source output is set by a setter so as to gradually increase the source output as shown in FIG. 3, while only the heating time is controlled by the sequence controller.

Figure 5:
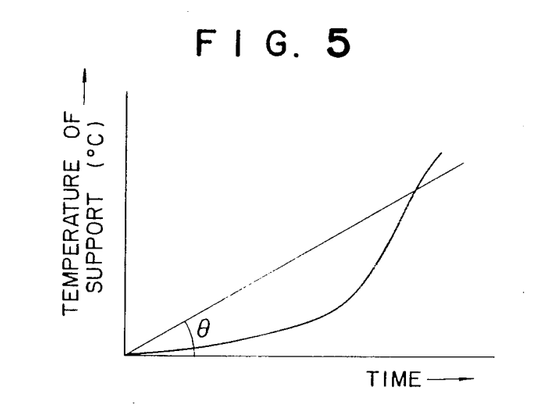
FIG. 5 shows the temperature rise characteristic of a support adapted to support semiconductor wafers.

However, the temperature of the support 36 adapted to support wafers 37 rises slowly as shown in FIG. 5 due to the heat capacity of the support thus failing to follow up the increase in the source output. More particularly, the temperature of the support increases very slowly at the start and rises abruptly at an intermediate point. Accordingly, the wafers 37 are subjected to this abrupt temperature variation, thus causing slip.

These problems have been solved by thickening the support or by gradually increasing the furnace temperature. However, these measures prolong the vapor phase growing time, thus increasing the cost of the products.

Another method of solving these problems utilizes a commercial temperature controller. This method can eliminate the defects of the first method in which the inclination angle $\theta$ is set by a variable resistor.

Figure 6:
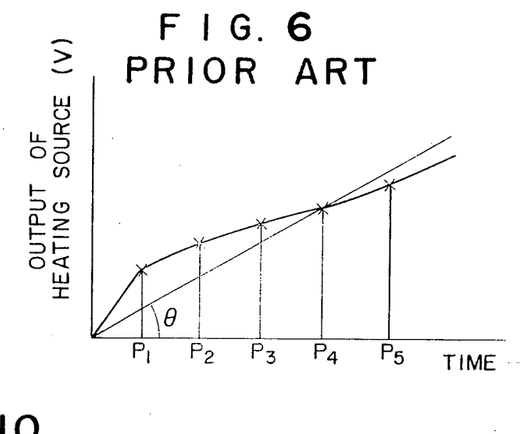
FIG. 6 is a graph showing a prior art method of controlling the temperature rise of the support.

More particularly, as shown in FIG. 6 the heating time required for the support to reach the operating temperature 1200° C., is divided into a plurality of sections $P_1, P_2, \ldots P_n$ by taking into consideration the temperature characteristic of the support, and rates of temperature variations of respective sections are preset so that the output increase rate of the source 11 will become high in time zones in which the rate of temperature rise of the support is low, whereas the output increase rate will be low in time zones in which the rate of temperature rise of the support is high.

Although this method enables to linearly control the temperature of the support it is necessary to set the rate of change at many points and to measure the actual temperature characteristic of the support for effecting the temperature change rates. Such troublesome measurement and setting must be made each time the support is exchanged.

Where the temperature is repeatedly raised and lowered in one process sequence and where the selected inclination angle $\theta$ differs in respective sequences, it is necessary to provide the temperature controllers of the same number as that of the sequences, thus increasing the cost of the control system.

SUMMARY OF THE INVENTION

Accordingly, it is an object of this invention to provide an improved semiconductor vapor phase growing apparatus capable of efficiently vapor growing semiconductors on semiconductor substrates in a short time without forming defective products.

Another object of this invention is to provide improved semiconductor vapor phase growing apparatus capable of efficiently growing semiconductor layers on semiconductor wafers by uniformly increasing the temperature thereof at a high speed without causing slip of the wafers.

According to this invention there is provided a semiconductor vapor phase growing apparatus wherein a semiconductor wafer is disposed in a reaction furnace, and an output of a source of heating, the temperature of the wafer, and flow quantities of gases supplied to the reaction furnace for vapor phase growing a semiconductor on the wafer by a chemical reaction of the gases are controlled by a control unit according to predetermined sequences, wherein there are provided temperature detecting means for detecting the temperature of the wafer in the reaction furnace and output control means controlling the output of the source of heating according to a given reference value, the control unit being constituted by memory means storing a program of executing the sequences and linearly raising and lowering the wafer temperature at a predetermined temperature gradient in a plurality of time interval units by making different rate of temperature change in respective time interval units, and means for processing the program.

DESCRIPTION OF THE PREFERRED EMBODIMENT

In the following description, the semiconductor vapor phase growing apparatus shown in FIGS. 1 and 2 are used, so that the control unit 14 will be described in detail.

Figure 7:
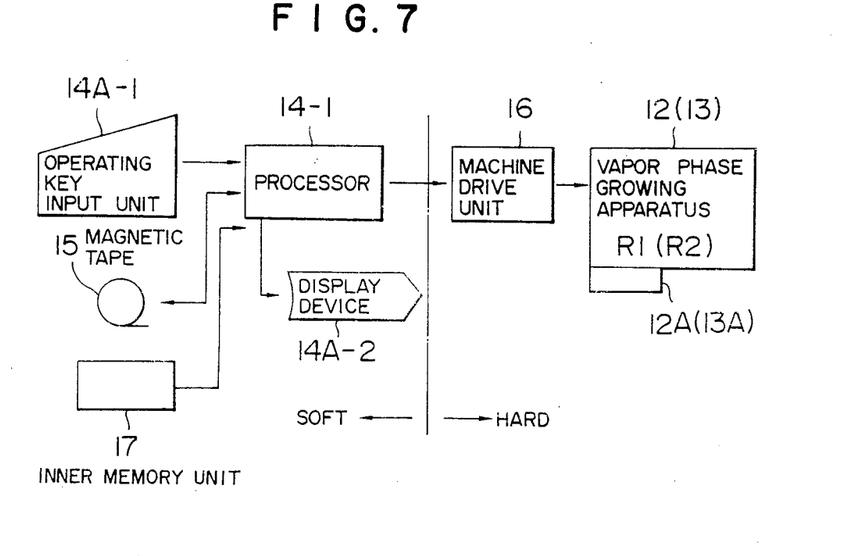
FIG. 7 is a diagrammatic block diagram showing the basic construction of the control unit embodying the invention.

As shown in FIG. 7, the control unit of this invention comprises, as its principal elements, a key input unit 14A-1, a magnetic memory device 15 for inputting a source program to the control unit, a switch input unit 17, a central processing unit (CPU) in the form of a microcomputer, for example. The CPU is supplied with a program, various instructions, or data from input units 14A-1, 17 and magnetic memory device 15 to execute and process these items. The control unit further comprises a display device 14-2 in the form of a cathode ray tube (CRT) which displays input and output informations of the CPU14-1, the result of processing thereof, and various messages, and an apparatus driver 16 constituted by a solenoid or a relay coil and controlled by the CPU14-1 for controlling ON•OFF of gas supply and reaction furnaces as well as various parts of the main bodies 12 and 13 of the vapor phase growing apparatus according to a program executed by the CPU, and operating panels 12A and 13A of the main bodies 12 and 13.

Figure 8:
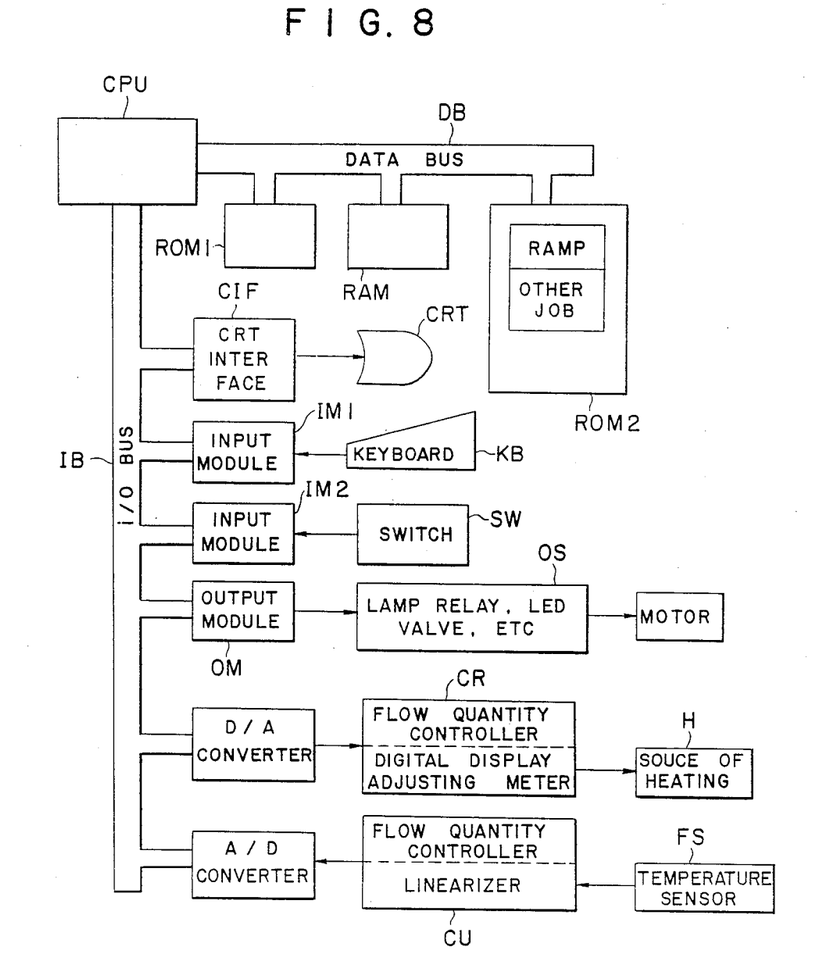
FIG. 8 is a block diagram showing the detail of the control unit embodying the invention.

The block diagram shown in FIG. 8 shows the detail of the control unit 14. A read only memory device ROM1 storing a control program, etc., a random access memory device RAM1 for temporarily storing external data, working data, other data, programs required for the CPU, and another read only memory device ROM2 are connected to the CPU via a data bus line DB. The ROM2 is used to store a ramp characteristic at the time of raising and lowering the furnace temperature, that is a data table described with the inclination angle of the temperature variation characteristic that is the target characteristic of the temperature variation, various messages to be displayed by the CRT and various subroutines.

To another bus line 1B to the CPU are connected a CRT interface CIF which displays on the CRT data given by the CPU; a input module IM1 which sends informations inputted from a keyboard KB to the CPU; an input module IM2 which informs the CPU 7 the ON•OFF states of a switch SW; an output module OM which in response to the instructions from the CPU controls OS including lamp relays, valves, LED's, etc., which in turn controls motors and other apparatus; a D/A converter converting digital signals into analog signals that control a control device CR including a gas flow quantity controller as well as a digital display adjuster for performing PID (proportional integral and differential operations) and temperature control. Thus when an instruction given from the CPU concerns a flow quantity the D/A converter supplies to a flow quantity controller a corresponding analog value, whereas in the case of a temperature instruction the D/A converter applies a corresponding analog instruction to a digital heating controller display adjuster. The control device CR also controls a high frequency generator H corresponding to 11 in FIG. 1 for controlling its output used to heat the reaction furnaces.

An analog digital converter A/D is also connected to the bus line 1B for sending the output of a converter CU to the CPU. The CU comprises such converters as linearizers that linearize the outputs of gas flow quantity detectors, and of the temperature sensors TS of the reaction furnaces by compensating the levels of these outputs to be commensurate with the output characteristic of the temperature sensors.

Figure 9:
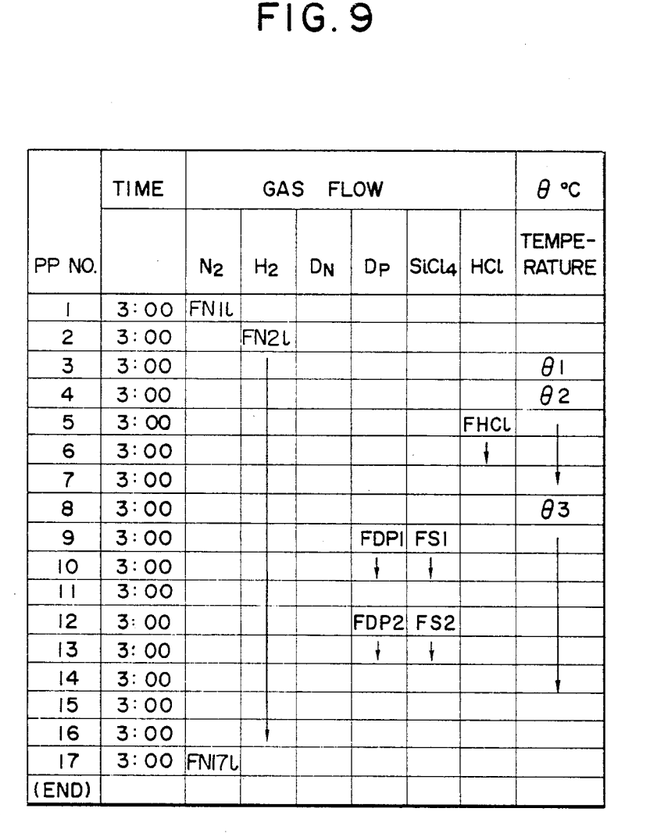
FIG. 9 is a graph showing one example of the sequences executed by the control unit.

The sequences of the control unit are shown in FIG. 9 in which PPNO designates sequence numbers, TIME the times of executions of respective sequences, GAS FLOW the types of gases to be supplied wherein $N_2$ represents nitrogen, $H_2$ hydrogen, $D_N$ a N type dopant gas, $D_p$ a P type dopant gas, $SiCl_4$ silicon tetrachloride, and HCl hydrogen chloride. $\theta°$ C. shows the furnace temperatures at respective sequences.

With these sequences, at step PPNO1, $N_2$ is supplied to a reaction furnace for 3 minutes at a flow rate of FN 1 l/min. to purge the furnace with fresh $N_2$. At steps PPNO2 through PPNO16, $H_2$ is continuously sent to the furnace at a rate of FH 2 l/min. During this interval the furnace temperature is raised to $\theta 1$ at step PPNO3 and to $\theta 2$ at step PPNO4, the temperature $\theta 2$ is maintained until the termination of step PPNO7. At step PPNO8 the temperature is changed to $\theta 3$ which is maintained until the termination of step PPNO14.

During an interval between steps PPNO5 and PPNO6 HCl is supplied at a rate of FHCl l/min., while during an interval between PPNO9 and PPNO10 the P type dopant gas DP is sent at a rate of FDP l/min. and $SiCl_4$ acting as a carrier gas at a rate of $FSiCl_4$ l/min. During an interval between steps PPNO12 and PPNO13 the P type dopant gas DP is supplied at a rate of FDP 2l/min. and $SiCl_4$ is supplied at a rate of $FSiCl_4$ l/min. At step PPNO17, $N_2$ is supplied for 3 minutes at a rate of FN 17 l/min. to purge the furnace. At the end of the step, the sequence is terminated.

Figure 10:
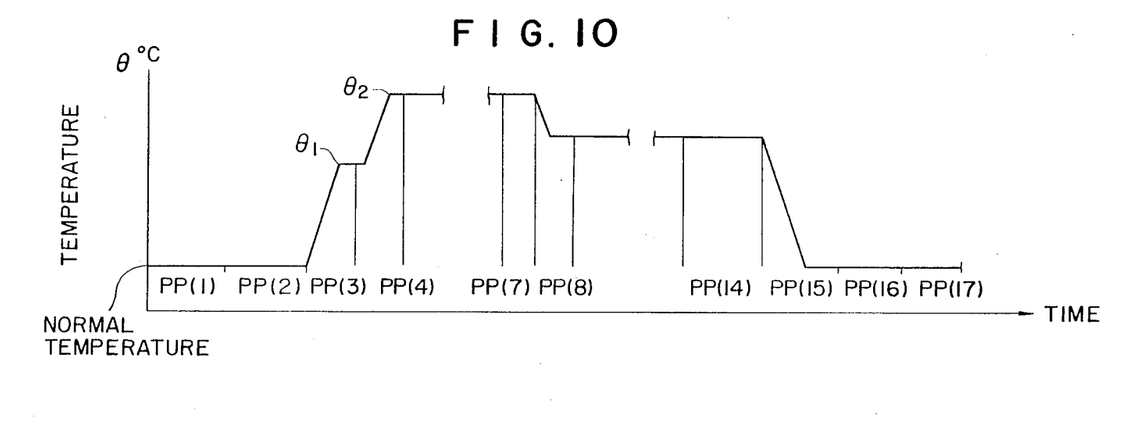
FIG. 10 is a graph showing the variation of the target value of the temperature control.

FIG. 10 shows the temperature variation of the reaction furnace during the successive sequences.

The contents of the sequences are stored in ROM1 as a program, and various conditions are inputted into the control unit by keyboard KB. To start the furnace, the CPU firstly executes the furnace control program in ROM1. At each sequence, instructions for controlling gas supply, opening and closing valves, for driving the support driving motor, for controlling gas flow quantities and designating the furnace temperature are applied to the output module OM and D/A converter from the CPU. Thus, the gas flow quantity information is supplied to the flow quantity controller, and the temperature designation information is supplied to the digital display adjuster for controlling the gas flow quantities and the furnace temperature.

The detected values of the gas flow quantities and the furnace temperature are sent to the CPU via A/D converter which executes respective sequences by correcting, i.e. modifying the control operations by referring to these detected values.

The principal object of this invention is to raise the furnace temperature to about 1200° C. most suitable for the vapor phase growth in a minimum interval, while preventing slip of the wafers especially liable to occur at the time of quick temperature rise.

To this end, according to this invention the control program is prepared in the following manner and executed by the CPU to control the furnace temperature.

More particularly, according to this invention, by taking into consideration the fact that the slip occurs at about 1000° C., it is advantageous to control the temperature in a range of from 800° C. to 1200° C. and to make short one ramp interval as far as possible. Accordingly, the temperature reference is changed slightly during the sequence time so as to linearly rise the furnace temperature.

The procedure of controls according to the sequences shown in FIG. 9 will now be described.

Figure 11:
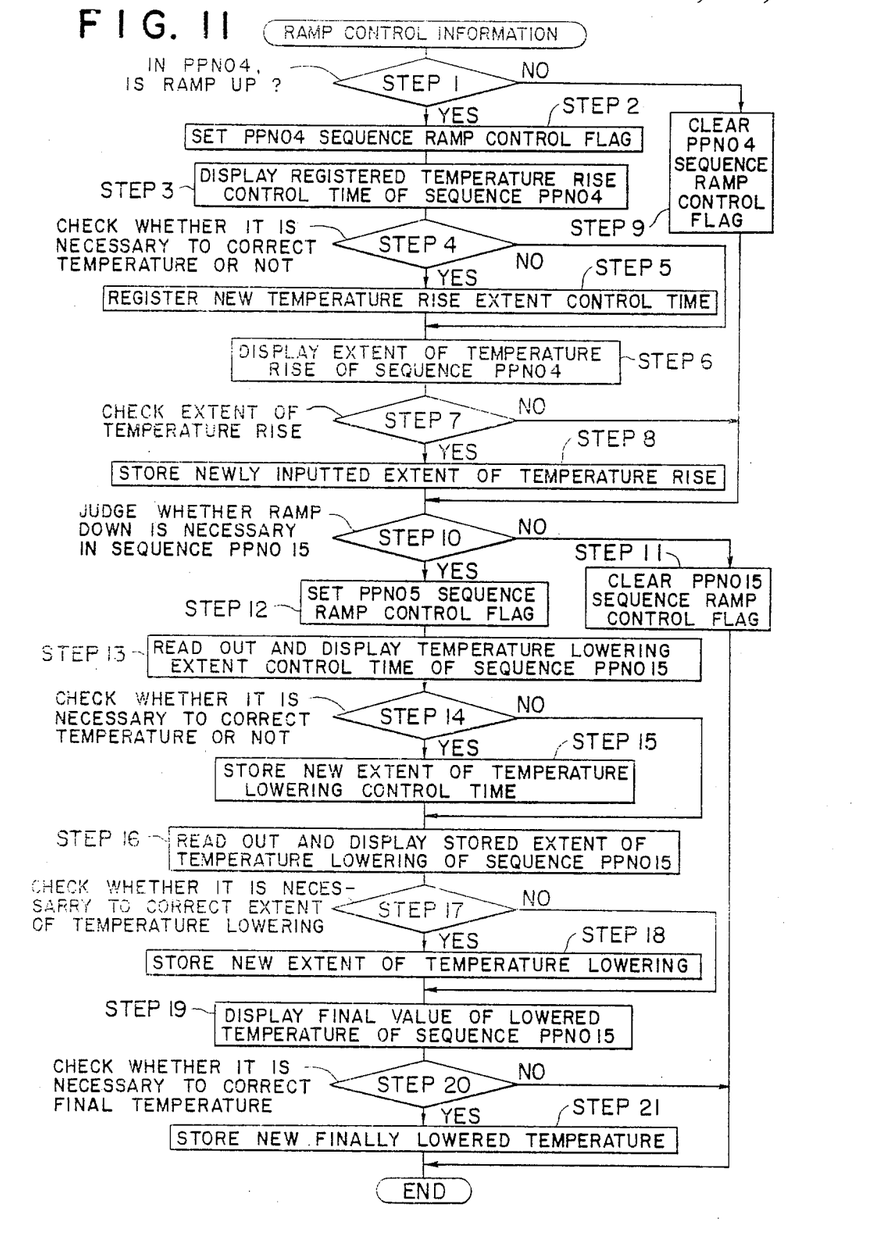
FIG. 11 is a flow chart showing the input routine of a ramp control information of this invention.

FIG. 11 shows a flow chart inputting a ramp (temperature raising and lowering) showing only two examples of temperature raising and lowering of sequence numbers PPNO4 and PPNO15.

Designations of the temperature slope and ramping time are sufficient for effecting highly accurate ramping.

For a sequence in which the ramping is effected, it is necessary to determine whether the ramping is to be made or not, and when the ramping is to be made it is necessary to preset its contents. The chart shown in FIG. 11 is used for such procedures.

More particularly, as the execution of the program of the control unit is commenced the routine for ramp control information input routine is started to execute step 1.

In this example, it is supposed that the sequences for raising and lowering the temperature are PPNO4 and PPNO12. Then at step 1, a check is made whether the procedure is ramp up (temperature rise) or not in the sequence PPNO4. This procedure is done by supplying a message to the CRT. According to the processing content, ramp up is not made, so that in the case of ramp up information for it is inputted with the keyboard KB, and the information is inputted to the CPU for executing step 1. When the result of this step is YES, at step 2 a ramp control flag for the PPNO4 sequence is set. Since step 3 is a routine for displaying the preregistered temperature rise time of the sequence PPNO4, the CPU executes this routine to read out the ramping time or the temperature rise control time for one sequence and gives the read out time to the CRT to display its content. At step 4, check is made as to whether it is necessary to correct or not. If correction is necessary, a message is sent to the CRT to know the extent of correction.

Depending upon whether correction is necessary or not, a signal YES or NO is inputted from the keyboard and the CPU judges whether the signal is YES or NO at step 4. When the result of this step is YES, at step 5 a new extent of temperature rise control time inputted from the keyboard KB is registered in RAM and the program is transferred to step 6. When no correction is necessary the program is jumped from step 4 to step 6. At step 6, the extent of temperature rise in one ramping time is displayed on the CRT. Then at step 7, a check is made as to whether it is necessary to correct the temperature rise to what extent or not. The result of check at step 7 is displayed on the CRT by the CPU and necessary extent of correction is inputted by the keyboard KB.

When the result of step 7 is YES, at step 8 the newly inputted extent of temperature rise is stored in RAM. When, the result of step 7 is NO, the program is jumped to step 10.

When the result of step 1 is NO, at step 9 the ramp control flag of the sequence PPNO4 is cleared and then the program is transferred to step 10. However, when the RAMP control flag has been cleared the RAMP control is omitted.

At step 10, a judgement is made as to whether the RAMP down (temperature lowering) is necessary in sequence PPNO15 or not. The result of this judgement is also displayed on the CRT and keyboard KB is operated to satisfy the result of the judgement.

When the result of the judgement at step 10 is NO, at step 11 the RAMP control flag of the sequence PPNO15 is cleared so as to register that the RAMP control is unnecessary, thereby terminating the routine regarding the ramp control information.

When the result of judgement of step 10 is YES, a ramp control flag for the sequence PPNO15 is set. Then at step 13, stored one ramp time, the temperature lowering extent control time for sequence PPNO15 is read out and displayed on the CRT. Then at step 15, a check is made as to whether it is necessary to correct the control time by what extent, and the result is also displayed on the CRT. The operator operates the keyboard to perform the required correction.

When the result of step 14 is YES, at step 15 the newly inputted temperature lowering extent control time is stored in RAM and the program is advanced to step 16. When the result of step 14 is NO, at step 16 the extent of temperature lowering for one ramping time, which is stored at sequence PPNO15, is read out and displayed on the CRT. Then at step 17, a check is made as to whether it is necessary to correct the extent of temperature lowering to determine the amount of correction. This amount is also displayed on the CRT and inputted with the keyboard KB.

When the result of step 17 is NO, the program is jumped to step 19, whereas when the result is YES, at step 18 the inputted value is stored as a new extent of temperature lowering.

At step 19, the final value of the lowered temperature of the sequence PPNO15 is read out and displayed on the CRT. Then at step 20 a judgement is made as to whether it is necessary to correct the final value of the lowered temperature and the result of the check is displayed on the CRT and corrected with the keyboard KB. When the result of step 20 is NO, the RAMP control information inputting procedure is terminated.

When the result of step 20 is YES, at step 21 the newly inputted finally lowered temperature is stored, thus terminating the ramp control information input procedure.

When the above described routine has been executed, information regarding execution of the ramping or not, the temperature gradient and the ramping time of the sequences PPNO4 and PPNO15 are stored.

Figure 12:
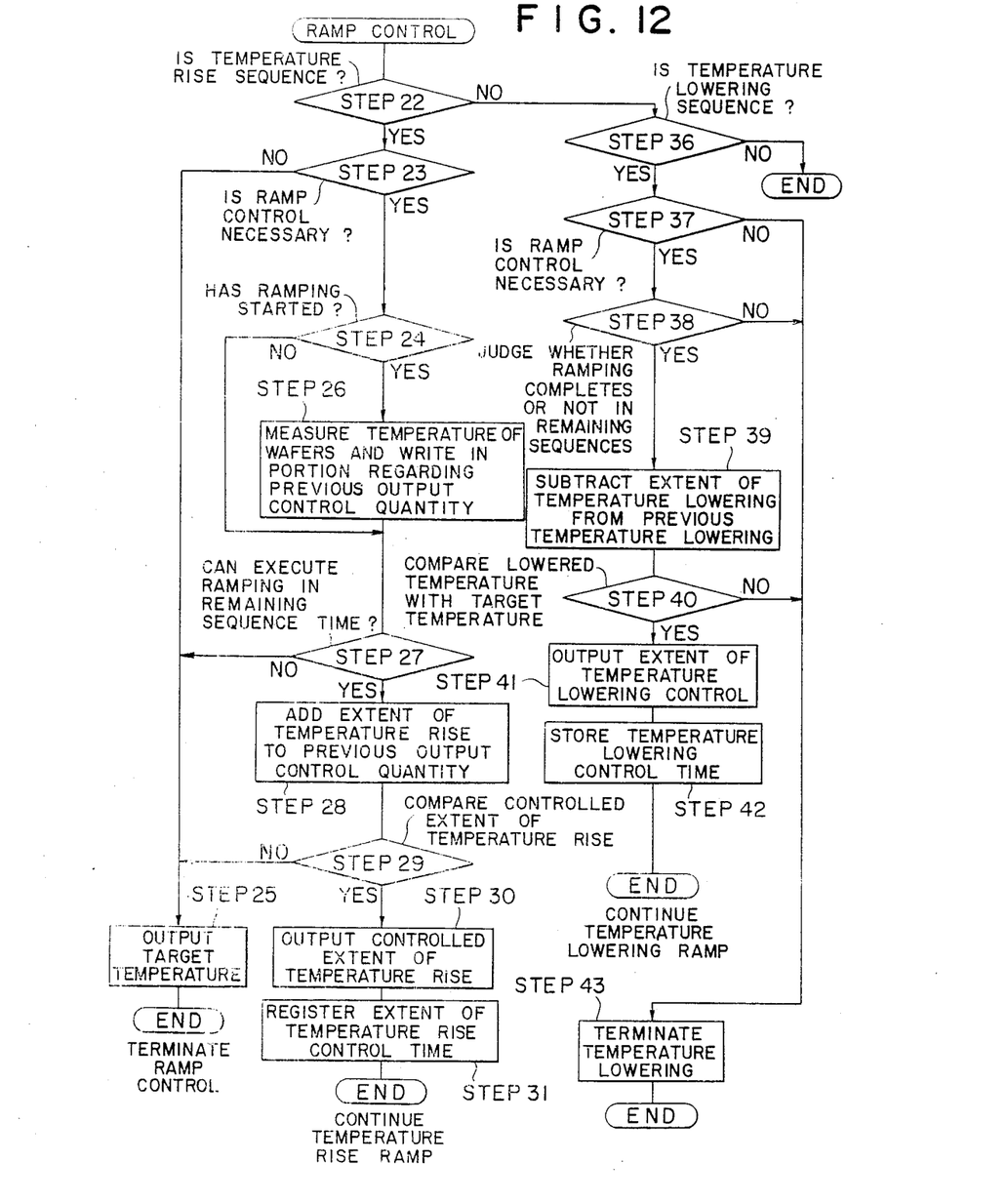
FIG. 12 is a flow chart showing a ramp control routine.

Upon completion of the ramp control information routine, the main program having the content as shown in FIG. 9 is executed. When the program enters into the sequence of PPNO4, the ramp control routine as shown in FIG. 12 is commenced to effect the ramp control.

More particularly, in the ramp control routine, step 22 is executed to check whether the sequence is a temperature raising sequence or not.

Since the main program contains a temperature raise sequence when the present sequence is PPNO4, whereas a temperature lowering sequence in the case of the sequence PPNO15, in the case of the temperature raising sequence, the program is transferred to step 23 from step 22, whereas in the case of the temperature lowering sequence the program is transferred to step 36. Since at step 2 or 9, a flag regarding ramping or not is set, at step 23 a check is made whether ramp control is to be made or not in accordance with the content of the flag. When the result of step 23 is YES, at step 24 a judgement is made whether the ramping is to be started or the ramping is now being executed. When the ramping is to be started, at step 26 the output of the temperature sensor TS is read through a linearizer and an A/D converter to form the present temperature information of the wafers being heated, which is written into a memory area indicating the previous output control quantity. At step 27 the remaining time of the sequence PPNO4 measured at the time of commencing the ramp control routine is compared with one ramping time assigned to sequence PPNO4. When the remaining time is large the program is advanced to step 28 whereas in the opposite case the step is transferred to step 25 because the remaining time is too small.

At step 25, a target temperature set for sequence PPNO4 is outputted. When the result of step 23 is NO, the step 25 is also executed. The outputted target temperature is applied to a digital display and adjuster through a D/A converter to control the furnace temperature to the target value.

At step 28, where the ramping is possible for a predetermined time in the remaining sequence time, the extent of temperature rise preset in one ramping time is added to the previous output control quantity to determine the extent of temperature rise, that is the target temperature in the present ramping time. Then at step 29 the controlled extent of the temperature rise is compared with the target temperature of the sequence PPNO4. When the former is smaller than the latter the program is advanced to step 30, whereas in the opposite case, at step 25 the furnace temperature is maintained at the target temperature. At step 30 the controlled extent of temperature rise is outputted which is given to the digital display adjuster so as to control the high frequency generator such that the furnace temperature becomes the target temperature. Then at step 31, a temperature rise control time, that is one ramping time, for example, 3 or 6 seconds, is set. The one ramping time thus set is registered in a second processing program for supervising each ramping time.

Figure 13:
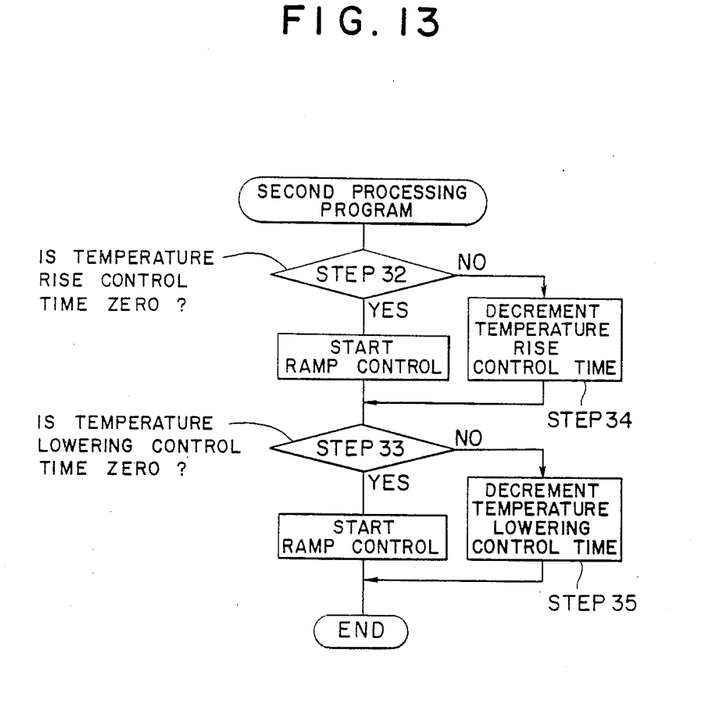
FIG. 13 is a flow chart showing a second processing program.

The detail of the second processing program is shown in FIG. 13 in which, at step 32, a judgement is made whether the temperature rise control time is zero or not. When the result of this judgement is NO, at step 34 the temperature rise time is decremented, and at step 33 the second processing routine for lowering the temperature is executed.

The content of this routine is substantially the same as those of steps 32 and 34. Thus at step 33 a judgement is made whether the registered temperature lowering control time, that is one ramping time, is zero or not, and when the result is NO, at step 35 the temperature lowering control time is decremented.

These processings are performed at a spacing of one second and when the temperature rise control time becomes zero, the ram control routine is executed. In the same manner, when the temperature lowering control time becomes zero, the ramp control routine is executed.

In the second processing program, supervisions of the times of temperature raising and lowering are performed independently because two reaction furnaces are controlled alternately. Where a single furnace is used, duplicate routines may be combined into a single routine.

In the second processing program when one ramping time elapses, the ramp control routine is started again to repeat the procedures described above.

Then, the result of step 24 becomes NO so that the step 26 is omitted, and at step 28 the previous extent of temperature rise is calculated as the previous output control quantity.

Since the furnace temperature at the time of starting the ramping has been set at the initial stage, the temperature at the starting point has been determined so that the desired temperature control can be realized by giving the extent of temperature rise at each ramping. It is also possible to store actual temperature at respective rampings.

As above described as the temperature rise control proceeds, the remaining time of the sequence reduces, or when the temperature exceeds the target value, at step 25 the target temperature is given to the digital display adjuster so as to control the high frequency generator such that the furnace temperature will reach the target value.

When at step 25, the difference between the target temperature and the actual furnace temperature is large enough to cause a slip of the wafers, since this means that the extent of temperature rise or the temperature settings in the preceding sequences are not adequate, the temperature should be carefully set.

At the sequence PPNO15, in which the main program comprises temperature lowering sequences, the ramp control routine is executed again.

At step 22, when it is judged that the sequence is not the temperature raising sequence, at step 36 a judgement is made whether the sequence is a temperature lowering sequence or not. If the result of the judgement is NO the program is returned to the main program, whereas when the result is YES at step 37 a judgement is made whether it is necessary to effect ramp control or not. This step is executed by observing a flag set at steps 11 and 12. If the result of step 38 is NO, at step 43 the high frequency generator is stopped t terminate heating.

When the result of step 37 is YES, at step 38 the remaining time of the sequence PPNO15, independently supervised, is compared with a preset ramping time so as to judge whether the ramping is completed or not in the remaining sequences. When the result is NO, the program is jumped to step 43 whereas when the result is YES, at step 39 the temperature of the wafers measured by the temperature sensor TS is stored as the previous output control quantity. More particularly, so long as the temperature raising or lowering control is not effected, the furnace temperature is controlled to a value corresponding to the output control quantity which has been the temperature control reference up to the previous sequence so that the detected temperature can be used as the previous output quantity. The preset extent of temperature lowering in one ramping time is subtracted from the previous output control quantity and the difference is used as the extent of temperature lowering, that is a temperature control reference.

Then, at step 40, the finally lowered temperature, that is a preset final target temperature, is compared with the lowered temperature. When the lowered temperature is higher than the target temperature, at step 41 the extent of temperature lowering control is outputted which is given to the digital display adjuster via a D/A converter, whereby the output of the high frequency generator is controlled to bring the furnace temperature to the controlled lowered temperature.

Then at step 42, the preset one ramping time or the temperature lowering control time (for example 6 seconds) is stored. After that the second processing program is executed. When the stored time expires, the ramp control routine is executed again to lower temperature. Thus in each stored time, ramping is executed until a newly lowered temperature is reached.

As the remaining sequence time becomes less than one ramping time or when the extent of temperature lowering becomes smaller than the temperature at the end point of temperature lowering the temperature lowering sequence is terminated at step 43.

After that the program is returned to the main program to execute the next sequence.

As above described, in a sequence requiring ramping, the ramping control is repeated with a unit ramping time set shorter than an execution time assigned to the sequence and at a rate preset to be adequate to reach the final target value to reach the target temperature within the execution time of the sequence, so that it is possible to finely ramp with a small time unit. According to this ramping control, the furnace temperature can be increased linearly with a desired angle of inclination without accompanying the problem of slip of the wafers. Moreover, the temperature control is made with a program, the temperature control can be made accurately and readily. In other words, according to this invention, even in a temperature range in which the slip tends to occur, rapid temperature change does not occur with the result that the wafers are not subjected to severe heat shock and that the temperature gradient can be made to be a maximum, thus improving the productivity.

I claim:

1. In a semiconductor vapor phase growing apparatus wherein a semiconductor wafer is disposed in a reaction furnace, which includes a source for heating and a gas supply means and the output of said source for heating, the temperature of the wafer, and flow quantities of gases supplied to the reaction furnace for vapor phase growing a semiconductor on the wafer by a chemical reaction of the gases are controlled by a control unit according to predetermined sequences, the improvement comprising temperature detecting means for detecting the temperature of the wafer in the reaction furnace, and output control means controlling the output of said source of heating according to a given reference value, wherein said control unit includes memory means for storing a program for executing said sequences and linearly raising and lowering the wafer temperature at a predetermined temperature gradient in a plurality of divided time interval units by making different rates of temperature change in respective time interval units, and means for processing said program.

2. The apparatus according to claim 1 further including means for taking the temperature of said wafer as a reference at the time of executing sequences of varying the temperature, and wherein said processing means includes means for determining the temperature reference value by correcting said rates of temperature change, in respective time interval units, in amounts adequate to reach a last target temperature in respective sequences, and means for applying said corrected rates of temperature changes to said source of heating.

3. The apparatus according to claim 1 wherein said memory means comprises a ROM storing a program storing program sequences for executing said temperature changes.

4. The apparatus according to claim 1 wherein said reaction furnace comprises a rotary support adapted to support a plurality of said semiconductor wafers, and said source for heating is a high frequency induction coil for heating said wafers.

* * * * *